United States Patent
Pu

(10) Patent No.: US 6,184,573 B1
(45) Date of Patent: Feb. 6, 2001

(54) CHIP PACKAGING

(75) Inventor: Han-Ping Pu, Yunho (TW)

(73) Assignee: Siliconware Precision Industries Co., Ltd., Tantzu Taichung (TW)

( * ) Notice: Under 35 U.S.C. 154(b), the term of this patent shall be extended for 0 days.

(21) Appl. No.: 09/310,727

(22) Filed: May 13, 1999

(51) Int. Cl.[7] .................................................. H01L 23/495
(52) U.S. Cl. ........................... 257/666; 257/676; 257/723; 257/777; 257/786
(58) Field of Search ..................................... 257/666, 777, 257/676, 723, 786

(56) References Cited

U.S. PATENT DOCUMENTS 5,349,238 * 9/1994 Ohsawa et al. ....................... 257/672
5,677,567 * 10/1997 Ma et al. .............................. 257/723
5,729,440 * 3/1998 Jimarez et al. ....................... 257/772

* cited by examiner

Primary Examiner—Roy Potter
(74) Attorney, Agent, or Firm—Bacon & Thomas

(57) ABSTRACT

The invention provides a chip package, particularly a dual-chip package, that is featured by directly connecting a lead frame to at least a chip included therein, and is specifically featured by directly connecting the inner leads of a lead frame to the bumps formed on at least two chips included therein.

11 Claims, 3 Drawing Sheets

CHIP PACKAGING

FIELD OF THE INVENTION

The present invention generally relates to a package including at least a semiconductor chip having at least a bump connected directly to a lead frame, and particularly to a dual-chip semiconductor package including at least two semiconductor chips each having at least a bump connected directly to a lead frame.

BACKGROUND OF THE INVENTION

With the use of wire-bonding or TAB (Tape Automated Bonding) technology, Conventional semiconductor packages, particularly the semiconductor packages each including at least two chips, suffer problems such as too long trace, connection of two lead frames, complicated material preparation and packaging processes, as well as the quality defects incurred in molding due to the weaker mechanical strength of TAB.

With semiconductor packages tending to be light and thin while chips gradually becomes larger in size to meet more sophisticated function demand, various schemes have been suggested for packaging a chip or more than a chip in such ways that the completed package as a whole can be smaller, particularly can be lighter and thinner. One among the various schemes is the prior art disclosed in U.S. Pat. No. 5,331,235 and represented by FIG. 1, which suggested a semiconductor package including at least two semiconductor chips 32 and 34 respectively having bumps 33 and 35 thereof facing each other and being connected to a lead frame 37 through tapes 31, wherein a solder 36 is interposed between the two semiconductor chips; which also suggested another scheme as shown in FIG. 2 where a semiconductor package C includes at least two semiconductor chips 32 and 34 respectively having bumps 33 and 35 thereof facing each other, and being connected to tapes 31 that are connected to lead frame 37 partly inserted between the two semiconductor chips 32 and 34.

Although various schemes other than the above two were also suggested by the same prior art, they are all characterized by using tapes for electrical connection between bare chips and lead frames, thereby still suffer problems similar to those suffered by conventional semiconductor packaging, resulting in the need of developing a new scheme to keep pace with the trend of demanding renovated multi-chip semiconductor packages, leading to the suggestion of the present invention.

SUMMARY OF THE PRESENT INVENTION

Objects

It is a primary object of the invention to provide a semiconductor package including at least two chips having bumps thereon connected directly with a lead frame, in order to reduce manufacturing cost and completed package size, and to simplify packaging process as well as minimize production failure rate in packaging semiconductor chips.

It is another object of the invention to provide a method of packaging at least two semiconductor chips for reducing manufacturing cost and completed package size, and for simplifying packaging process as well as minimizing production failure rate.

It is a further object of the invention to provide a semiconductor package including at least a semiconductor chip and a lead frame wherein the lead frame is connected directly to the bump formed on the semiconductor chip so that the problems, particularly the inherent problem of long trace, suffered by prior arts can be minimized.

Introduction to the Invention

The semiconductor package suggested by the present invention is featured by the direct connection between the lead frame thereof and the bumps of the semiconductor chips therein, i.e., the semiconductor package according to the present invention is featured by comprising: at least two semiconductor chips each having at least a bump formed on the metal pad (such as Al pad) therein; and a lead frame having at least an inner lead connected with the bump on a first semiconductor chip of the two semiconductor chips and the bump on a second semiconductor chip of the two semiconductor chips, thereby there is no need of wire-bonding and TAB technology.

Obviously the above package may be enclosed by encapsulation through a molding process for convenient applications, as can be understood by anybody skilled in the art.

Although an embodiment of the above semiconductor package recommended by the present invention is such that the bump on the first semiconductor chip and the bump on the second semiconductor chip face each other and are connected directly with an inner lead of the lead frame, the semiconductor package according to the present invention is not limited to the configuration of connecting the inner lead to the two chips' respective bumps facing each other, instead, the scheme suggested by the present invention for connecting a lead frame directly to the bump of a chip may be applied to semiconductor packages of various configurations as long as the chip therein and the lead frame thereof are connected on the basis suggested by the present invention. It is therefore obvious that the present invention can be applied to a semiconductor package including a single chip.

The above semiconductor package may have its bump made of material selected from among solder, Au, Ni, and any substance providing electrical conductivity, and have its lead frame's inner lead in the width not larger than a size which approximately equals, before the inner lead is connected to the bump, the diameter of the bump; the lead frame is preferably made of material having wettability for connecting with solder in case the bump is a solder bump.

A method suggested by the present invention for packaging at least two semiconductor chips each having at least a bump thereon, and a lead frame having at least an inner lead, is characterized by comprising the steps of: connecting the inner lead to the bump on a first semiconductor chip of the two semiconductor chips; and connecting the bump on a second semiconductor chip of the two semiconductor chips with the inner lead, thereby a semiconductor packaging process can be facilitated and become relatively economical.

DETAILED DESCRIPTION OF THE PREFERRED EMBODIMENTS

Figure 5:
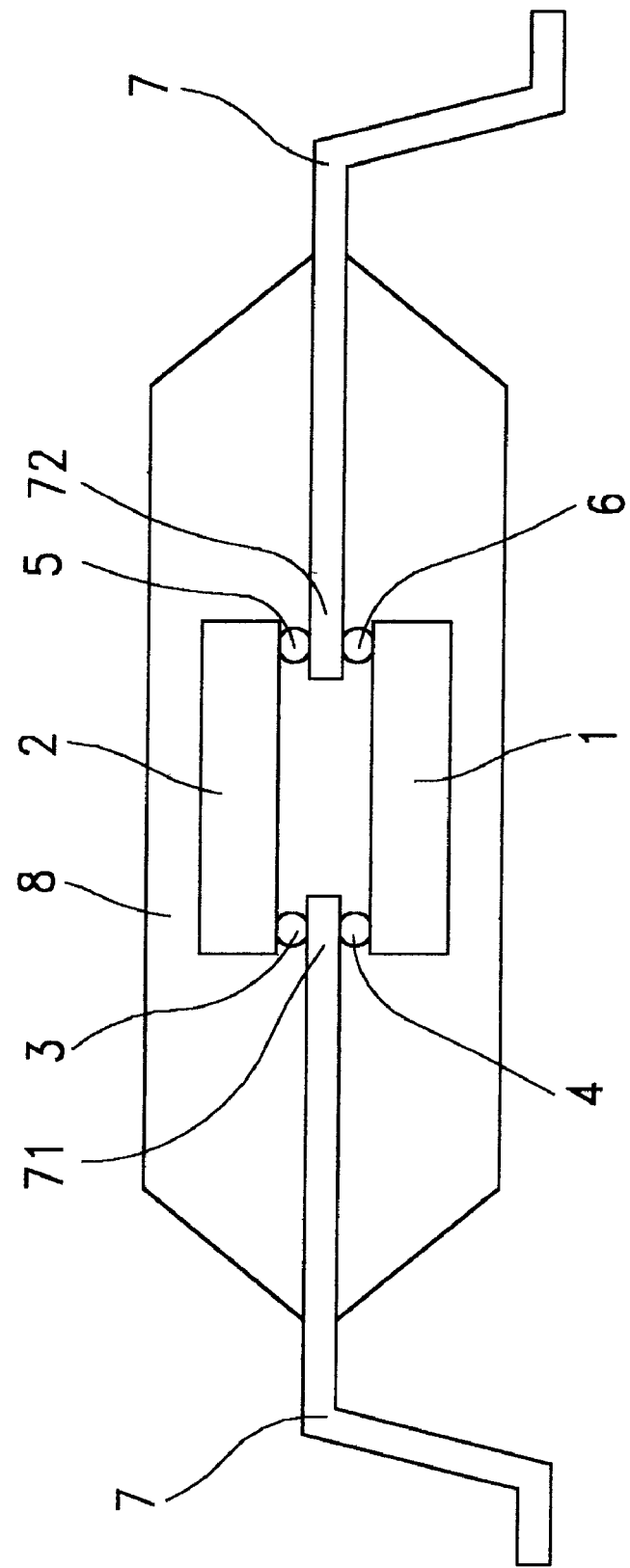
FIG. 5 shows another embodiment according to the present invention in which the embodiment defined in FIG. 4 is enclosed by encapsulation with lead frame partly exposed.

An embodiment of a semiconductor package according to the present invention is illustrated by a cross sectional view shown in FIG. 5 where a first semiconductor chip 1 has bumps 4 and 6 respectively connected with inner leads 71 and 72 of a lead frame 7 which are respectively connected with bumps 3 and 5 of a second semiconductor chip 2, the bumps 3 and 5 of the second semiconductor chip 2 respectively face the bumps 4 and 6 of the first semiconductor chip 1, a configuration (or structure) with inner leads of a lead frame interposed and seated between two chips and connected with the bumps of the two chips is thus achieved, thereby the trace in the semiconductor package can be significantly minimized. Obviously the two chips 1 and 2 as well as the lead frame 7 may be enclosed, for more convenient applications, by encapsulation 8 with lead frame 7 partly exposed for external connection. Usually a semiconductor chip has its bump formed on a metal pad (such as a Al pad) therein.

The above semiconductor package may have its bumps such as 3, 4, 5, and 6 made of material selected from among solder, Au, Ni, and any substance providing electrical conductivity, and have its lead frame inner leads 71 and 72 in the width not larger than a size which approximately equals the diameter of the bumps 3, 4, 5, and 6 measured before the inner lead 71 and 72 are connected thereto; the lead frame 7 is preferably made of material having wettability for connecting with solder in case the bumps are solder bumps.

The above semiconductor package according to the present invention may have its lead frame 7 made of material selected from among Fe—Ni alloy and Cu alloy such as Alloy 42 and C7025.

The above semiconductor package according to the present invention may have each bump (such as 3, 5 for example) of second semiconductor chip 2 correspond to an inner lead (such as 71, 72 for example) and each bump (such as 4, 6 for example) of first semiconductor chip 1 correspond to an inner lead (such as 71, 72 for example).

The above semiconductor package according to the present invention has bumps such as 3, 5 of second semiconductor chip 2 and bumps such as 4, 6 of the first semiconductor chip 1 respectively made of two kinds of solder of different melting points, i.e., in case the bumps are solder bumps, the bumps such as 3 and 5 of semiconductor chip 2 have a melting point different from that of the bumps such as 4 and 6 of semiconductor chip 1, with a preferable difference of at least 20 Celsius degrees. The difference in the melting point of solder bumps between first semiconductor chip 1 and second semiconductor chip 2 can be achieved by having the bumps on the first semiconductor chip 1 and the bumps on the second semiconductor chip 2 made of respective kinds of solder comprising Pb (plumbum) and Sn, and differing in component ratio of Pb to Sn. Another type of alloy such as Sn—Ag, Sn—Sb (stibium) may also be used. It is preferable all the solder bumps in the semiconductor package have melting points higher than molding temperature of molding the semiconductor package.

The above semiconductor package according to the present invention may have solder attached on the metal pad of the chip therein through a process selected from among electroplating and screen printing, followed by reflow soldering. A metal layer between the solder and the metal pad is recommended for better connection between the metal pad and the solder.

Figure 1:
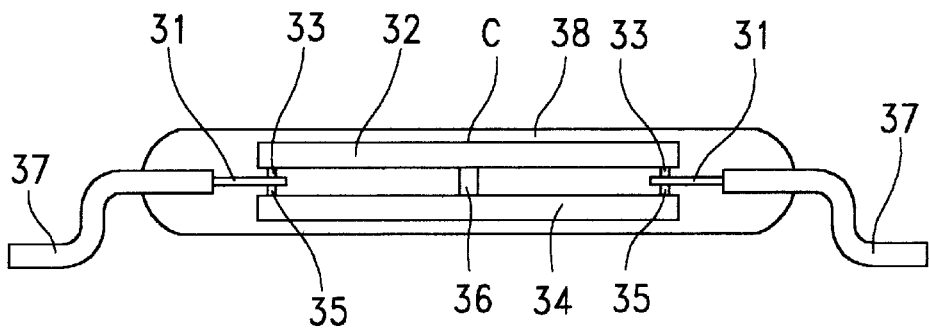
FIG. 1 shows an embodiment of a prior art.
Figure 2:
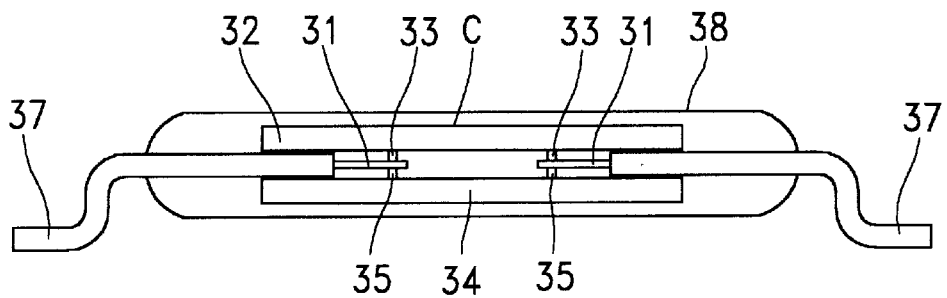
FIG. 2 shows another embodiment of the prior art.
Figure 3:
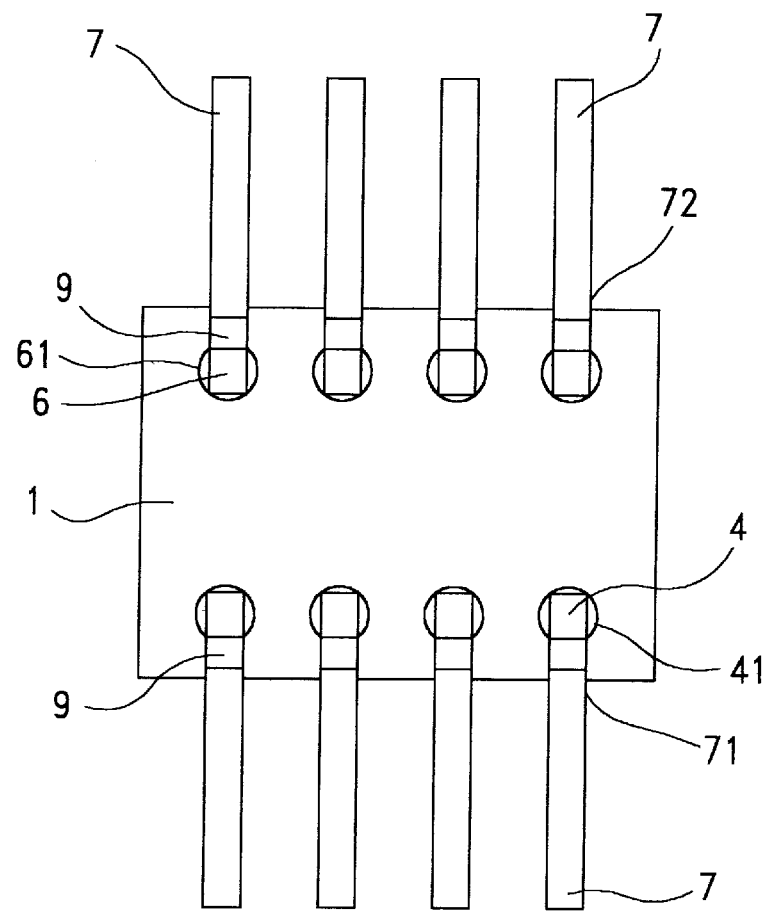
FIG. 3 shows an embodiment according to the present invention in which the inner leads of a lead frame are directly and respectively connected to the bumps on a semiconductor chip.
Figure 4:
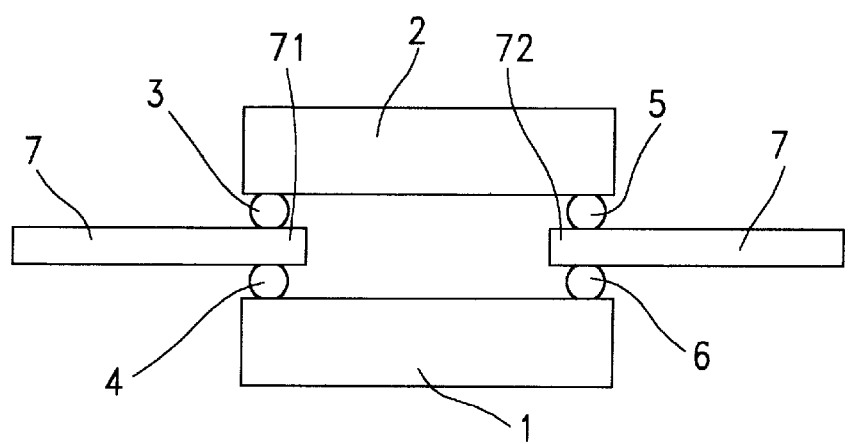
FIG. 4 shows an embodiment according to the present invention in which the inner leads shown in FIG. 3 are connected with the bumps of another semiconductor chip.

A embodiment of a method according to the present invention is illustrated by FIG. 3 and FIG. 4. As shown in FIG. 4, two semiconductor chips 1 and 2 each having at least a bump such as 4, 6 and 3, 5 thereon, and a lead frame 7 having at least an inner lead such as 71 and 72, are connected for being packaged. The method comprises the steps of:

(a). connecting the inner leads 71 and 72 respectively to the bumps such as 4 and 6 on the first semiconductor chip 1 as shown in FIG. 3; and (b). connecting the bumps such as 3 and 5 on the second semiconductor chip 2 to the inner leads 71 and 72 respectively, thereby inner leads such as 71 and 72 are interposed and seated between the two chips 1 and 2, specifically between bumps 5 and 6 and between bumps 3 and 4 respectively.

In the embodiment of the above method suggested by the present invention, in case the bump is a solder bump, the inner lead is connected to the solder bump by reflow soldering accompanied with application of material selected from among flux and solder paste, and the embodiment may further comprise, before step (a), a step of forming solder masks such as 9 shown in FIG. 3 for limiting solder flow existing when the inner leads such as 71 and 72 are connected to the solder bumps such as 4, 41 and 6, 61 by reflow soldering. Solder masks 9 may be formed by screen printing to have a width of at least 10 micrometer, and each inner lead's end which is to be connected with a bump is spaced from the solder mask by a gap of size determined according to the width of the inner lead or the diameter of the bump. Specifically the inner lead's end which is to be connected with a bump is spaced from the solder mask by a gap of size selected from among the approximate width of the inner lead and the approximate diameter of the bump.

In the embodiment of the above method according to the present invention, in case the bump on the first semiconductor chip and the bump on the second semiconductor chip are made of the same kind of solder, the weight of the first semiconductor chip 1 should be less than the surface tension supplied by all soldering areas on the first semiconductor chip 1.

The embodiment of the above method according to the present invention may further comprise, for the connection between the bump and the inner lead in case the bump is made of solder, a step of dipping flux into the bump or printing flux, by screen printing, on the location where the inner lead and the bump are to be connected; and may also further comprise, in case the bump is made of Au (gold), a step of reflow soldering, on the bump, some solder paste which has a component of Sn (tin), or adding electrical paste to the bump accompanied with curing thereafter.

What is claimed is:

1. A semiconductor package comprising:
    at least two semiconductor chips each having at least a bump thereon; and
    a lead frame having at least an inner lead connected with the bump on a first semiconductor chip of said at least two semiconductor chips and the bump on a second semiconductor chip of said at least two semiconductor chips; with the provisos that the bump on said first semiconductor chip and the bump on said second semiconductor chip are made of solder of different melting points.

2. The semiconductor package of claim 1 wherein the bump on said first semiconductor chip and the bump on said second semiconductor chip face each other.

3. The semiconductor package of claim 1 wherein said bump is made of material selected from among solder, Au, Ni, and substance providing electrical conductivity, and said inner lead has a width not larger than a size which approximately equals, before said inner lead is connected to said bump, the diameter of said bump.

4. The semiconductor package of claim 1 wherein when said bump is made of solder, said lead frame is made of material providing wettability for connecting with solder.

5. The semiconductor package of claim 1 wherein said frame is made of material selected from among Fe—Ni alloy and Cu alloy.

6. The semiconductor package of claim 5 wherein said Cu alloy is selected from among Alloy 42 and C7025.

7. The semiconductor package of claim 1 wherein each of said at least a bump corresponds to one of said at least an inner lead of said lead frame.

8. The semiconductor package of claim 1 wherein the bump on said first semiconductor chip and the bump on said second semiconductor chip are made of solder with melting points higher than molding temperature of molding the semiconductor package.

9. The semiconductor package of claim 1 wherein said semiconductor chip has at least a metal pad having solder attached thereon by a process selected from among electroplating and screen printing, and then by reflow soldering to form at least a solder bump thereon.

10. The semiconductor package of claim 9 further comprising a metal layer between the solder and said metal pad.

11. At least two semiconductor chips each having at least a bump thereon; and a lead frame having at least an inner lead connected with the bump on a first semiconductor chip of said at least two semiconductor chips and the bump on a second semiconductor chip of said at least two semiconductor chips;

with the provisos that the bump on said first semiconductor chip and the bump on said second semiconductor chip are made of respective kinds of solder comprising Pb and Sn, and differing in component ratio of Pb to Sn so as to have different melting points.

* * * * *